(12) United States Patent
Kess

(10) Patent No.: US 8,324,889 B2
(45) Date of Patent: Dec. 4, 2012

(54) MAGNETIC RESONANCE SYSTEM WITH ORIENTATION DETECTION OF TOOLS

(75) Inventor: Helmut Kess, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 279 days.

(21) Appl. No.: 12/561,615

(22) Filed: Sep. 17, 2009

(65) Prior Publication Data

US 2010/0072985 A1   Mar. 25, 2010

(30) Foreign Application Priority Data

Sep. 23, 2008   (DE) .................. 10 2008 048 476

(51) Int. Cl.
*G01B 7/14* (2006.01)
(52) U.S. Cl. ..................................... 324/207.2; 600/410
(58) Field of Classification Search ........... 324/300–322
See application file for complete search history.

(56) References Cited

U.S. PATENT DOCUMENTS

| 5,300,883 | A | 4/1994 | Richeson |
| 7,230,428 | B1 | 6/2007 | Ishii |
| 2005/0245811 | A1* | 11/2005 | Scheffler ........................ 600/410 |
| 2006/0255796 | A1* | 11/2006 | Shoji .............................. 324/252 |
| 2007/0170917 | A1* | 7/2007 | Thompson et al. ........... 324/307 |
| 2008/0234557 | A1 | 9/2008 | Demharter |
| 2009/0121707 | A1* | 5/2009 | Schott ........................ 324/207.2 |

* cited by examiner

*Primary Examiner* — Huy Q Phan
*Assistant Examiner* — Temilade S Rhodes-Vivour
(74) *Attorney, Agent, or Firm* — Schiff Hardin LLP

(57) ABSTRACT

A magnetic resonance system has a basic field magnet that generates a static basic magnetic field that is essentially homogeneous within an examination volume, the basic magnetic field having a basic direction. At least one tool can be inserted into the examination volume and can be removed from it. The at least one tool has a number of Hall elements. Each Hall element of the at least one tool is fashioned such that a binary signal emitted by said Hall element characterizes whether the basic magnetic field has a component that, relative to a respective element direction of the respective Hall element, is greater than a threshold. The respective element directions of the respective Hall elements differ from one another in pairs. The Hall elements of the at least one tool communicate in terms of data with an evaluation device of the magnetic resonance system to transmit the binary signal that it emits. The evaluation device uses the transmitted binary signal to determine an orientation of the at least one tool relative to the basic direction and takes additional measures depending on this orientation.

5 Claims, 2 Drawing Sheets

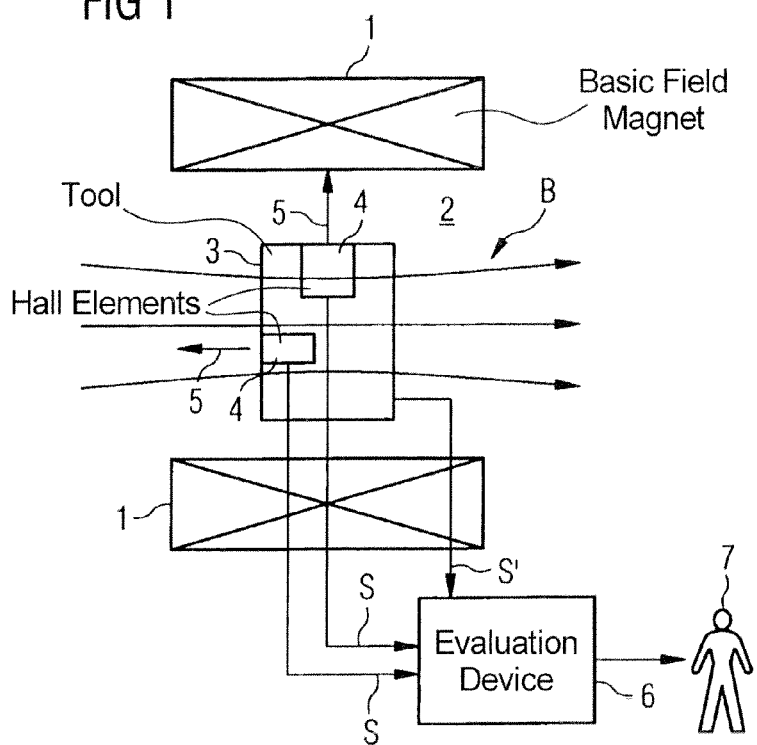
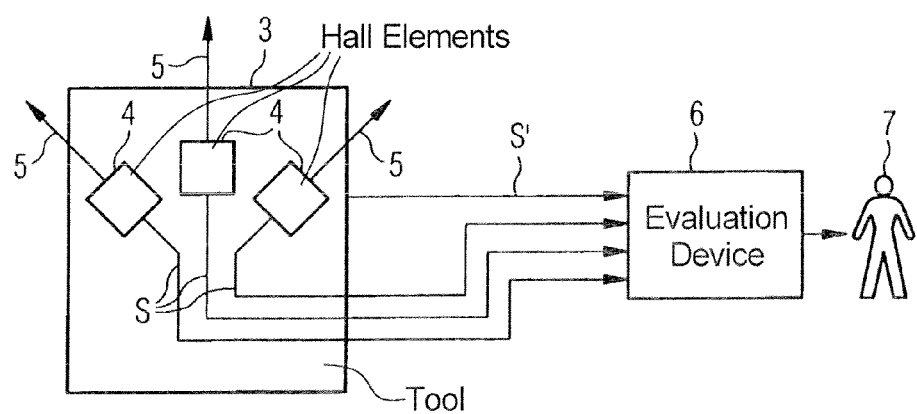

MAGNETIC RESONANCE SYSTEM WITH ORIENTATION DETECTION OF TOOLS

BACKGROUND OF THE INVENTION

1. Field of the Invention

The present invention concerns a magnetic resonance system of the type having a tool equipped with hall elements that allow the orientation of the tool to be determined relative to the direction of the basic magnetic field of the system.

2. Description of the Prior Art

Magnetic resonance systems are known that have a basic magnet that generates a static basic magnetic field that is essentially homogeneous within an examination volume, the basic magnetic field possesses a basic direction, and wherein the magnetic resonance system possesses an evaluation device and at least one tool that can be inserted into the examination volume and can be removed therefrom. It is known for the at least one tool to have (carry) a Hall element that is emits a binary signal that characterizes whether the basic magnetic field has a component that, relative to an element direction of the Hall element, is greater than a threshold. The Hall element communicates in terms of data with the evaluation device in order to transmit the binary signal that it emits. The evaluation device uses the transmitted binary signal to determine an orientation of the at least one tool relative to the basic direction and takes additional measures depending on this orientation.

In this known magnetic resonance system, the tool is normally fashioned as a surface coil. The threshold of the Hall element is so small that it is negligible in comparison with the basic magnetic field. Therefore the orientation within a semispherical solid angle range can essentially be detected by means of this known magnetic resonance system.

For some applications, however, the precision that can be achieved by the prior art is too coarse.

SUMMARY OF THE INVENTION

An object of the present invention is to provide a magnetic resonance system having a Hall element-equipped tool, wherein the orientation of the tool can be determined more precisely than in conventional systems.

According to the invention, the (at least one) tool has a number of Hall elements. Each Hall element of the at least one tool is fashioned such that a binary signal emitted by that Hall element characterizes whether the basic magnetic field has a component that, relative to a respective element direction of that Hall element, is greater than a threshold. The respective element directions of the respective Hall elements differ from one another in pairs. The Hall elements of the at least one tool are connected in terms of data with the evaluation device to transmit the binary signals that they emit. The evaluation device is configured to use the binary signals transmitted thereto, to determine an orientation of the at least one tool relative to the basic direction and to take additional measures depending on this orientation. In the simplest case, the additional measure is the output of a corresponding message to a user/operator of the magnetic resonance system.

It is possible for the number of Hall elements of the at least one tool to be exactly two. In this case the respective element directions of the two Hall elements of the tool are advantageously orthogonal relative to one another.

If the number of Hall elements of one tool is greater than two, in an additional preferred embodiment the respective element directions are linearly dependent relative to one another on three of the respective Hall elements. In this case a greater angle resolution can be achieved in the rotation plane.

In the special case that the number of Hall elements of the tool is exactly three, it is furthermore possible for the respective element directions of the Hall elements of the one to be orthogonal relative to one another in pairs. In this case the orientation of the tool can be precisely determined to an octant.

BRIEF DESCRIPTION OF THE DRAWINGS

FIG. 1 schematically illustrates a magnetic resonance system constructed and operating in accordance with the present invention, with a first embodiment of a Hall element-equipped tool in accordance with the present invention.

FIG. 2 schematically illustrates a second embodiment of a Hall element-equipped tool in accordance with the present invention.

DESCRIPTION OF THE PREFERRED EMBODIMENTS

As shown in FIG. 1, a magnetic resonance system has a basic field magnet 1. The basic field magnet 1 generates a basic magnetic field B. The basic magnetic field B is static. The basic magnetic field B is essentially homogeneous within an examination volume 2. The basic magnetic field B exhibits a basic direction indicated in FIG. 1 by the field lines of the basic magnetic field B with direction arrows.

Figure 3:
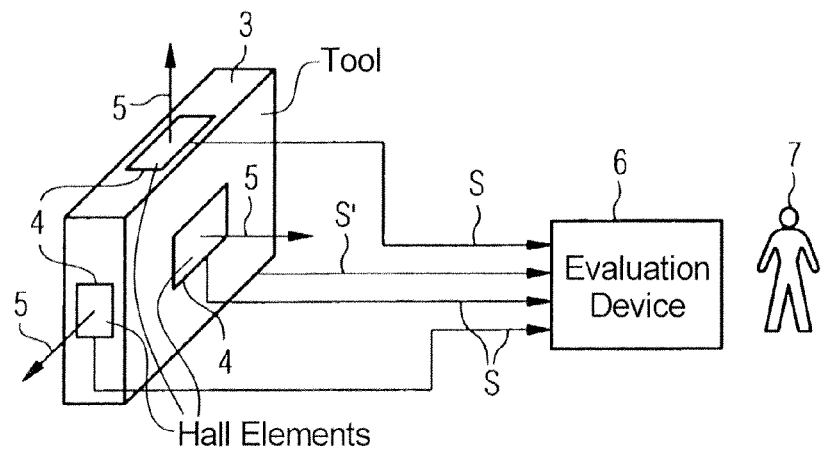
FIG. 3 illustrates a third embodiment of a Hall element-equipped tool in accordance with the present invention.

The magnetic resonance system furthermore has at least one tool 3, for example a surface coil or a different local coil. The tool 3 can be inserted into the examination volume 2 and removed from it. The at least one tool 3 has a number of Hall elements 4. The minimal number of Hall elements 4 is two. This case is shown in FIG. 1. Alternatively—see FIGS. 2 and 3—the at least one tool 3 can also possess more than two Hall elements 4. In the embodiment according to FIG. 2, it is assumed that the number of Hall elements 4 is greater than two. It can thus be three, four, five etc. In the embodiment according to FIG. 3, it is assumed that the number of Hall elements 4 is exactly three.

Figure 4:
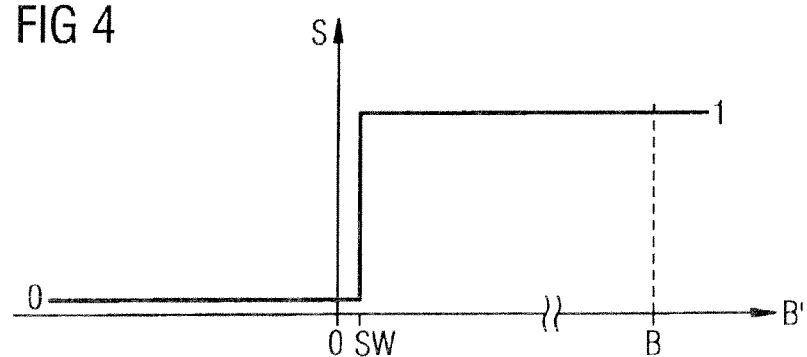
FIG. 4 shows the response characteristic of a Hall element used in the present invention.

Each Hall element 4 exhibits a response characteristic, as is shown in FIG. 4. According to FIG. 4, every Hall element 4 emits a binary signal S. The binary signal S exhibits a value of one if a magnetic field to which the appertaining Hall element 4 is exposed has a component B' that is greater than a threshold SW in an element direction 5 of the respective Hall element 4. Otherwise, the respective binary signal exhibits a value of zero. The threshold SW is for the most part in the range of approximately 1 mT, sometimes also slightly above or below this. In any case, however, the threshold SW lies well below the strength of the basic magnetic field B, which is normally at least 0.2 T and in many cases is even greater than 1 T. In the present case in which the Hall elements 4 are exposed to the basic magnetic field B of the basic magnet 1, for every Hall element 4 the binary signal S emitted by the respective Hall element 4 is thus characteristic of whether the basic magnetic field B possesses a component that is greater than the threshold SW relative to the respective element direction 5 of the respective Hall element 4.

The element directions 5 of the Hall elements 4 are different from one another in pairs, thus are linearly independent. In the embodiment according to FIG. 1, in which exactly two Hall elements 4 are present, the element directions 5 of the Hall elements 4 of the at least one tool 3 are advantageously orthogonal relative to one another. In the embodiment from FIG. 2, the element directions 5 of the Hall elements are in fact likewise different from one another in pairs. However, the element directions 5 of three of the respective Hall elements 4 are linearly dependent relative to one another. The element directions 5 thus lie in a common plane. In the embodiment from FIG. 3, in which the number of Hall elements 4 of the at least one tool 3 is exactly three, the element directions 5 of the Hall elements 4 of the at least one tool 3 are advantageously orthogonal in pairs relative to one another.

The Hall elements 4 of the at least one tool 3 are connected in terms of data with an evaluation device 6 of the magnetic resonance system. The data connection of the Hall elements 4 with the evaluation device 6 serves for the transmission of the binary signals S emitted by the Hall elements 4 to the evaluation device 6. The evaluation device 6 is fashioned such that it evaluates the binary signals S transmitted to it. In particular, using the binary signals S transmitted to it the evaluation device 6 determines an orientation of the at least one tool 3 relative to the basic direction of the basic magnetic field B. The evaluation device 6 takes additional measures depending on this orientation. For example, it can output a corresponding message to a user 7 via a screen (not shown). Alternatively or additionally, depending on the orientation of the tool 3 it can set an operating mode in which it operates the tool 3. Alternatively or additionally, an evaluation method by means of which a signal S' (in particular a magnetic resonance signal) detected by the tool 3 is evaluated can also be determined depending on the orientation of the at least one tool 3.

In practice, in many cases four possibilities exists to orient the tool 3 relative to the basic direction of the basic magnetic field B. If this orientation is designated as a reference orientation, the other three orientations are +90°, +180° and +270° relative to this basic orientation. In particular in this case it is entirely sufficient to provide exactly two Hall elements 4 whose element directions 5 are orthogonal to one another.

The Hall elements 4 normally exhibit a small switching hysteresis. However, the switching hysteresis is tolerable in the normal case. In cases in which the switching hysteresis is not tolerable, a corresponding angle precision can be achieved by providing additional Hall elements 4.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance system comprising:
a basic field magnet that generates a static basic magnetic field that is substantially homogenous within an examination volume, said basic magnetic field having a basic field direction;
an evaluation device;
a tool adapted to be inserted into, and removed from, said examination volume;
a plurality of Hall elements carried by said tool;
each Hall element being configured to emit a binary signal when said basic magnetic field has a component that, relative to an element direction of the respective Hall element, that is greater than a threshold and a second level when said basic magnetic field does not have a component, relative to said element direction of the respective Hall element, that is greater than said threshold, the respective element directions of the respective Hall elements differing from each other in pairs;
each Hall element being in communication with said evaluation device and transmitting the respective binary signal therefrom to the evaluation device; and
said evaluation device being configured to use the respective binary signals received from the respective Hall elements, and that the respective elements direction of the respective Hall elements differ from each other in pairs, to determine an orientation of said tool relative to said basic field direction, and to initiate a response dependent on the determined orientation.

2. A magnetic resonance system as claimed in claim 1 wherein said tool carries exactly two of said Hall elements, said two Hall elements having respective element directions that are orthogonal to each other.

3. A magnetic resonance system as claimed in claim 1 wherein said tool carries more than two of said Hall elements, and wherein the respective element directions of three of the respective Hall elements are linearly dependent relative to one another.

4. A magnetic resonance system as claimed in claim 1 wherein said tool carries exactly three of said Hall elements, and wherein the respective element directions of said three Hall elements are orthogonal relative to each other in pairs.

5. A magnetic resonance system as claimed in claim 4 wherein said evaluation device is configured to use said respective binary signals, and that the respective element directions of the respective Hall elements differ from each in pairs, to determine said orientation of said tool relative to said basic field direction with a resolution of an octant of a solid spherical angle.

* * * * *